United States Patent
Tryggvason et al.

(10) Patent No.: US 7,227,489 B2
(45) Date of Patent: Jun. 5, 2007

(54) DIGITAL DATA ACQUISITION SYSTEM

(75) Inventors: Bjami V Tryggvason, London (CA); Sani Amr El Kholy, Brossard (CA)

(73) Assignee: Milad Technology Inc., London, ON (CA)

( * ) Notice: Subject to any disclaimer, the term of this patent is extended or adjusted under 35 U.S.C. 154(b) by 0 days.

(21) Appl. No.: 11/304,747

(22) Filed: Dec. 16, 2005

(65) Prior Publication Data

US 2006/0132346 A1    Jun. 22, 2006

Related U.S. Application Data

(60) Provisional application No. 60/637,763, filed on Dec. 22, 2004.

(51) Int. Cl.
*H03M 1/12* (2006.01)

(52) U.S. Cl. ............... 341/155; 341/139; 341/143

(58) Field of Classification Search ............... 341/139, 341/143, 155; 375/316
See application file for complete search history.

(56) References Cited

U.S. PATENT DOCUMENTS

| | | | |
|---|---|---|---|
| 5,786,919 A * | 7/1998 | Habboosh et al. | 398/98 |
| 5,844,512 A * | 12/1998 | Gorin et al. | 341/139 |
| 2003/0007553 A1* | 1/2003 | Fifield | 375/232 |
| 2006/0055579 A1* | 3/2006 | Fontaine et al. | 341/155 |
| 2006/0092059 A1* | 5/2006 | Guimaraes | 341/143 |

* cited by examiner

*Primary Examiner*—Khai M. Nguyen
(74) *Attorney, Agent, or Firm*—George A. Seaby

(57) ABSTRACT

A digital data acquisition system includes a buffer amplifier for receiving an analog signal and attenuating all but those frequencies of interest, a low pass filter, a driver amplifier, an analog to digital converter for converting the analog signal to a digital signal, and a digital signal processor, which is preferably a field programmable gate array incorporating a digital filter and for effecting down sampling of a signal.

2 Claims, 2 Drawing Sheets

DIGITAL DATA ACQUISITION SYSTEM

This application claims priority on U.S. Provisional Application 60/637,763 filed Dec. 22, 2004.

BACKGROUND OF THE INVENTION

This invention relates to a digital data acquisition system, and in particular to a system and method for converting an analog signal to a digital signal.

FIELD OF THE INVENTION

Over the past two decades the use of analog signal recording has been drastically reduced as high performance digital data acquisition electronics have been developed. Almost all systems now use digital data acquisition and analysis. An essential difference between analog recording and digital recording is that in analog recording a signal is recorded continuously for example on a magnetic tape or is analyzed within analog electronic circuits. The frequency content that can be retained in such recordings or analysis is a function of the recording medium capability and the ability of the electronics to follow the time variations in the signal. Equipment such as tape recorders are capable of recording very high signal frequencies. For example an analog tape recorder used in music recordings can record frequencies of 40,000 Hz and higher. A tape recorder for video signals will typically be able to record signal variations in the tens of MHz. When such devices are used to record signals that have much lower frequency content, the fast response of the recording devices is able to record the signal without distortion of the low frequency portion of the signal since any high frequency signals mixed in with the signal of interest will be captured correctly. In analog recording the signal will be continuously recorded in time, capturing essentially the entire signal.

With digital recording only a small fraction of a signal is sampled and stored or analyzed. The signal is passed to an analog to digital converter (ADC), which samples the instantaneous value of the signal only at discrete times as controlled by the sampling electronics. For example a particular signal may be sampled at 1000 times per second at time intervals spaced apart by 0.001 second. The sampling process with modern ADCs typically takes microseconds or less. Hence, only a small fraction of the signal is sampled and is used to approximate the whole signal in subsequent display or analysis. As described below care must be taken to ensure that this sampled subset of the original signal accurately represents the portion of the signal that is of interest.

An ADC converter generates an approximation of the continuously varying analog signal that discretizes the signal in two ways. First, the digital representation of the analog signal can represent the originally continuously varying analog signal only in the form of discrete steps, i.e. the digital approximation of the analog signal, can take on only specific discrete values. For example if an 8-bit ADC is used to sample an analog signal that could range between 0 to 10V, the only levels that could be stored would be multiples of the minimum voltage change that could be detected, which would be $10 \text{ V}/2^8 = 10 \text{ V}/256 = 0.039063$ V. Hence any signal between 0 V and 0.039063 V would be represented as 0; a signal between 0.039063 V and 0.078126 V would be represented as 0.039063 V, a signal between 0.078126 V and 0.117189 V, would be represented as 0.078126 V, etc.

The digitizing process thus loses some of the information in the original signal. The number of bits in the digital representation of the signal defines the resolution of the ADC. A 10-bit ADC will have four times the resolution of an 8-bit ADC. A 16-bit ADC will have 256 times better resolution than an 8-bit ADC. For a 16-bit ADC the discrete step size in the above example becomes 0.000152 V, which clearly will have much less error than an 8-bit representation.

The second discretization occurs in time. As described above, an ADC will sample a signal only at specific times intervals. The signal will be sampled, for example over small time intervals of 1 microsecond or less. The sampling process will be repeated at fixed time intervals. For a sampling rate of 1000 s/s, the interval between samples will be 0.001 s. Hence only a small fraction of the original signal is sampled. In the example given 99.9% of the signal is ignored, while only 0.1% is sampled. Depending on the nature of the signal unless the proper analog signal conditioning is applied prior to digitizing, this can lead to significant distortion in the representation of the signal of interest.

If in the time interval between samples the signal does not change by more than the discretization resolution then no information is lost due to the missing segment of the signal. However, if there is variation in the signal level in between the samples that exceeds the discretization resolution, then there is a loss of information about the signal. Typically, in most real situations, a signal will be composed of a possibly slowly varying output from some measurement device plus an electrical noise signal that can have both well defined frequency content as well as random noise. The noise components can arise either due to the random input that drives a device producing a signal, or from noise added to the output signal of the device or picked up along the transmission path prior to the ADC. For example, this noise could come from pickup of the electromagnetic signals coming from the numerous radio and television signals. These are in the frequency range 500 kHz to GHz. Unless care is taken to protect the signal conditioning electronics from such noise it will be added to any real signal coming from the device generating the signal of interest.

Since this noise portion of the signal is effectively random, the exact timing of the sampled portion of the signal will be uncorrelated with the occurrence of the noise signal. The effect of sampling a noisy signal at sampling rates that are lower than the frequency of the noise component is that the noise component will appear mixed in with the desired signal.

When a signal is sampled at a given rate, the maximum frequency that can be identified in the discretely sampled version of the signal is given by the Nyquist frequency, which is one-half the sampling rate. For example, if a signal is sampled at 1000 s/s, the Nyquist frequency will be 500 Hz. No signal above this frequency can be detected in the discretely sampled version of the signal even if the original analog signal contains frequency components above the Nyquist frequency (500 Hz in this example). However, the energy associated with signal components above this Nyquist frequency will appear in the sampled signal but at frequencies below the Nyquist frequency. This shifting of high frequencies into the frequency range that is preserved in the discretely sampled signal is called aliasing. The frequency band that is retained in the discretely sampled signal will include the band $$f_{low} \leq f \leq f_{high} \text{ or } (f_l \leq f \leq f_h)$$

where the limiting frequencies are given by $$f_l = \frac{1}{T} \text{ and } f_h = \frac{1}{2\delta t}$$

where T is the total time over which the signal was sampled and δt is the time interval between sampling of the signal. All frequency components including those above $f_{h-}$ that were in the original signal prior to digitizing will appear within this band. This includes both signal components that where within this band as well as signal components that have been aliased into this frequency band. This aliasing phenomenon is well known and is described in many books on digital data acquisition.

To ensure that the signal within the retained frequency band is a true representation of the portion of the original signal that is within this frequency band, the signal must be filtered prior to the digitizing process to remove frequency components that are at frequencies above the band of interest. Hence digital data acquisition systems will typically include an electronic analog low pass filter circuit ahead of the ADC to attenuate signal frequencies above the frequencies of interest. This filter is typically referred to as a low pass filter (LPF). Many designs and devices for an LPF are available. There is however a common error made in selecting the cutoff frequency for the LPF in a digital data acquisition system. In many data acquisition systems the filter is set at or near the Nyquist frequency described above based on the premise that this frequency is the highest one that can be identified within the retained signal. However, realistic low pass filters act to slowly attenuate the signal amplitudes above the LPF cutoff frequency. By convention, the cutoff frequency is defined as the frequency where the signal has been attenuated by 3 dB (30% of amplitude). If the cutoff frequency is set to the Nyquist frequency then there will typically be aliasing of signals into the frequency band of interest, since above the cutoff frequency the attenuation increases slowly with frequency. Hence, proper selection of the filter should place the LPF cutoff frequency at approximately one-fifth the Nyquist frequency if a fourth order filter is used. The attenuation at the Nyquist frequency will then be quite high, limiting aliasing into the frequency band of interest, which is then defined as $f_l$ to $0.2f_h$. Note that the digitized signal includes frequencies up to $f_h$. However, there can be increased error in the sampled signal as this Nyquist frequency is approached.

The foregoing considerations result in a typical configuration for a data acquisition system including a buffer amplifier, which could be a differential amplifier, for receiving an analog signal, an LPF, a driver amplifier and an ADC. It should be noted that these are the basic elements that are required. A practical system may include various additional elements such as multiplexers, band pass filters and precision voltage reference for calibration. The LPF in this system configuration must be an analog device and the cutoff frequency must be set consistently with the sampling interval and the ADC resolution. For a single purpose data acquisition system this poses no problem, because once the frequency band of interest is selected, the filter frequency and the sampling rate can be selected. However, data acquisition systems are typically designed for multiple applications, and thus are typically capable of a wide range of sampling rate. However, the LPF cutoff frequency must still be matched for each desired sampling rate. This requires that if the sampling rate is changed then the LPF cutoff frequency must also be changed. There are devices that allow for this. One option is to have the LPF as a plug in unit that can be physically changed according to the required sampling rate which is cumbersome and requires the purchase or manufacture of new LPF modules for each sample rate. There are also signal conditioning electronics available that include complex filter stages where the filter cutoff frequency can be set within some range or where one of several preset filter cutoff frequencies can be selected. This requires complex and costly electronic circuitry. One variant of this approach that has modest cost is to use switched capacitive filters. However, this type of filter has relatively poor performance compared to filters with dedicated cutoff frequencies.

GENERAL DESCRIPTION OF THE INVENTION

An object of the present invention is to provide a data acquisition system with a relatively simple circuit design that allows for a wide range of overall cutoff frequencies, while retaining high filter performance.

Accordingly, the invention relates to a digital data acquisition system comprising:
(a) buffer amplifier means for receiving and amplifying an analog signal;
(b) low pass filter means for filtering an amplified analog signal from the buffer amplifier means;
(c) drive amplifier means;
(d) analog to digital converter means for converting the analog signal to a digital signal; and
(e) processor means for filtering and down sampling of a digital signal received from the converter means.

The invention also relates to a method for converting an analog signal to a digital signal comprising the steps of:
(a) passing the analog signal through a buffer amplifier to amplify the signal;
(b) effecting low pass filtering of the analog signal;
(c) passing the filtered signal through a drive amplifier;
(d) converting the analog signal to a digital signal; and
(e) digital filtering and down sampling the digital signal, wherein a low pass cutoff frequency during low pass filtering of the analog signal is fixed and is matched to a fixed sampling rate of the analog to digital converter, a desired overall cutoff frequency is implemented by digital filtering during the digital filtering and down sampling step, the desired output sampling rate is implemented in the down sampling step, and the cutoff frequency of the digital filter is matched to the output rate of the down sampling step.

BRIEF DESCRIPTION OF THE DRAWINGS

The invention is described below in greater detail with reference to the accompanying drawings, wherein.

DESCRIPTION OF THE PREFERRED EMBODIMENT

Figure 1:
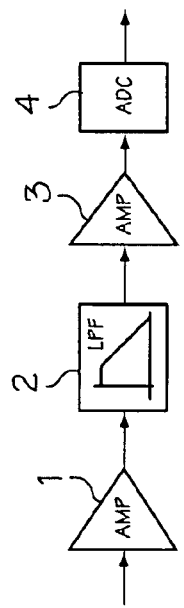
FIG. 1 is a schematic block diagram of a typical data acquisition system.

Referring to FIG. 1, as mentioned above, a typical configuration of a data acquisition system includes a buffer amplifier 1. An analog signal is passed through the amplifier 1 and an LPF 2 to a driver amplifier 3 and then to an ADC 4.

Figure 2:
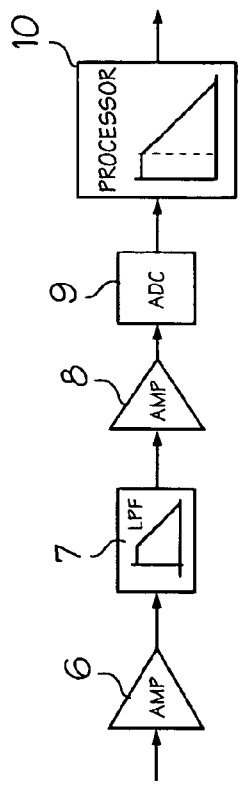
FIG. 2 is a schematic block diagram of a data acquisition system in accordance with the present invention.

With reference to FIG. 2, a digital data acquisition system in accordance with the present invention includes a buffer amplifier 6, which could be an instrumentation or differential amplifier, an analog low pass filter 7, a drive amplifier 8 and an analog to digital converter 9. The signal from the converter 9 passes through a processor 10, which can be a digital signal processor, a field programmable gate array, a microprocessor, an application specific integrated circuit or a digital signal processor to a device such as a personal computer (not shown).

In a preferred embodiment of the invention (FIG. 3), the signal processor 10 is a field programmable gate array (FPGA), which incorporates a digital low pass filter 11 and effects decimation, i.e. down sampling of the signal at 12.

The analog filter 7 is set at the highest frequency to be retained by the data acquisition system. The ADC sampling rate is set to be two or three orders of magnitude higher than the eventual highest desired sampling rate and at a rate such that the highest retained frequency in the sampled signal is well above the cutoff frequency of the analog filter 7. This will ensure that the sampled signal does not contain any aliased signal at the ADC output within the bandwidth of the filter 7. The analog filter attenuation at the ADC sampling frequency should be better than $6.02 \times N + 1.76$ dB, where N is the number of bits of the ADC. This attenuation level ensures that the ADC output has an alias free signal covering an N bit dynamic range within the bandwidth defined by filter 7. For retained bandwidth lower than that defined by the filter 7 and for the corresponding lower required sampling rate, further low pass filtering and decimation is done digitally within the digital processor.

This allows the design of the analog filter 7 to be relatively simple reducing complexity and cost. The system size is also reduced since implementing a high cutoff frequency in the analog stage requires physically smaller components. With a low cutoff frequency in the analog stage it becomes practically difficult to implement the low pass filter due to the physical size of the components required. The cutoff frequency for the digital filter 11 in the FPGA is set to that desired by the user, and the signal is decimated to the sampling rate desired. Since the final filter 11 is digital and programmable, its cutoff frequency can be set over a wide range simply through software. Through this approach a wide range of sampling rates can be accommodated with relatively simple electronics while retaining high performance and low cost for the system.

As an example, if the application required retaining frequencies up to 100 Hz, then the overall cutoff frequency will be set at 100 Hz and the sample rate at the DSP or FPGA output will be set to 1000 s/s. This can be achieved with an analog filter 7 with a cutoff frequency set to 10,000 Hz, a sampling rate at the ADC of 1 Ms/s, and a lowpass cutoff frequency for the digital filter 11 set to achieve an overall 100 Hz bandwidth. The digitally filtered signal will be decimated to the desired 1000 s/s in the decimation stage 12. This retained discrete version of the original signal (output 13) will be passed to a computer (not shown) for further processing, display and/or storage to a storage device.

Alternatively should the application require retaining frequencies up to only 10 Hz. The same analog filter 7 is still used, the ADC still samples at 1 Ms/s. Only the cutoff frequency of the digital filter 11 in the processor 10 is changed in the system by changing only the value of parameters in the digital filter 11 in software to give an overall filter of 10 Hz, and the signal is decimated in the decimation stage 12 to 100 s/s before being sent on. Thus, there is no need to modify the analog filter 7 in order to prevent aliasing into the bandwidth of interest.

This approach allows for a very wide range of applications with relatively simple and inexpensive electronics, while retaining the high performance of much more complex systems.

A side benefit of this approach is that the digital filter 11 and the decimation process have the effect of also increasing the resolution of the system compared to that achieved by the ADC 9 itself. For example if a 16 bit resolution is required, the ADC 9 can be a 12 bit ADC. The fast sampling, digital filtering and decimation will result in an increase in the effective resolution to 16 bits or even higher.

Figure 3:
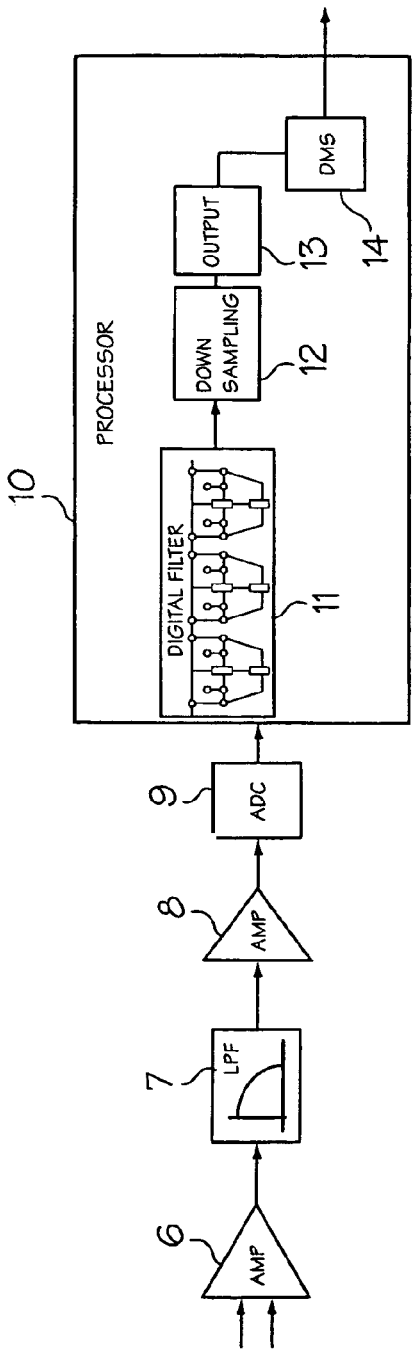
FIG. 3 is a schematic block diagram of one embodiment of the data acquisition system of the present invention.

The data acquisition system of FIG. 3 is capable of providing sample rates up to the sampling rate of the ADC, with an accurately retained signal bandwidth from DC up to the cutoff frequency of the analog LPF. The retained sampling rate can be decreased through application of the digital LPF and down sampling in the FPGA. The variable frequency of the digital filter in the FPGA provides the anti-aliasing for lower retained sampling rates. An example for the differential input is the LT1167 (available from Linear Technology Corporation). For current source signals, this amplifier can be configured for current input, converting the input to a representative voltage at the amplifier output. The signal is then passed through the low pass filter 7, which can be a relatively simple filter such as a PI filter or a Sallen-key filter. This reduces the number of components required and the cost of this section. The cutoff frequency of the analog filter is set quite high (in the example above to 10,000 Hz). In this example the analog filter provides attenuation of 130 dB above 998,000 Hz. Signals between 998,000 Hz and 1,000,000 Hz are aliased into the frequency range DC to 2,000 Hz. Signals with a frequency of 998,000 Hz will be aliased to 2,000 Hz; signals with a frequency of 1 MHz will be aliased to DC (0 Hz). However, the attenuation by at least 120 dB between 998,000 Hg and 1 MHz is such that the aliasing into the frequency range 0 to 2000 Hz is negligible. The low passed signal is sampled by the analog to digital converter 9 at 1,000,000 s/s (1 Ms/s). One option for the ADC 9 is the 16 bit AD7671 (available from Analog Devices). The ADC output is passed to the field programmable gate array (FPGA) 10. One option for the FPGA is the XCV600 (available from XILINX). There are several other options available. The digital filter 11 is incorporated into the FPGA 10.

The digital filter algorithm can be set to provide any one of several low pass filter characteristics such as a Butterworth, Elliptic or Chebyshev filter. In a practical implementation, the order of the filter can also be set to any order depending on the size of the FPGA. The order of the filter defines the attenuation rate with frequency, i.e., it defines how quickly the attenuation increases as the frequency increases. The output of the digital filter is a digital signal at 1,000,000 s/s in the above example and is passed to the decimation stage (DCM) 12 within the FPGA. In the above example the decimation stage selects every $500^{th}$ sample to pass to the output stage 13. All the other samples are discarded. The output stage 13 can accept digital data streams from several signals, each of which has been passed through a dedicated filter stage and decimation stage. The decimated digital signal streams are passed to a digital multiplexer stage 14. In this stage several digital signals are combined into a multiplexed serial bit stream for transmission out of the FPGA 10 to a device such as a personnel computer (PC) for storage or further processing. Within the PC or the subsequent electronics, the bit stream is de-multiplexed to recover all of the individual digital signals. The multiplexing and de-multiplexing steps are standard operations that can be implemented in several ways so are not described herein.

In a practical implementation, a data acquisition system can be designed to accept the input from several signal lines. In the first implementation of this approach, four input signals will be accommodated, with each signal having its own dedicated ADC. All four ADCs will pass their output to a single FPGA. This eliminates noise pickup between the outputs of the LPFs and the input of the ADCs. It is common practise to use a single ADC to digitize multiple signals. In such designs each signal has its own buffer amplifier stage and LPF. The output of the LPFs are passed to an analog multiplexer than sequentially passes the signal to a fast ADC. The ADC samples first one signal, then another, then another, etc., until all signals have been sampled. The disadvantage of this standard approach is the several sources for noise pickup following the LPF stage, both within the multiplexer from switching noise and from the wire traces that pass these signals from the LPF to the multiplexer and from the multiplexer to the ADC. Also channel to channel isolation is compromised due to the pickup induced from the analog multiplexer.

The approach in this new design reduces the noise that can be picked up between the LPF and the ADC as these two components can be placed within close proximity of each other. This results in a low-noise high-resolution data acquisition system that is relatively low cost due to simplified design and lower parts count.

Figure 4:
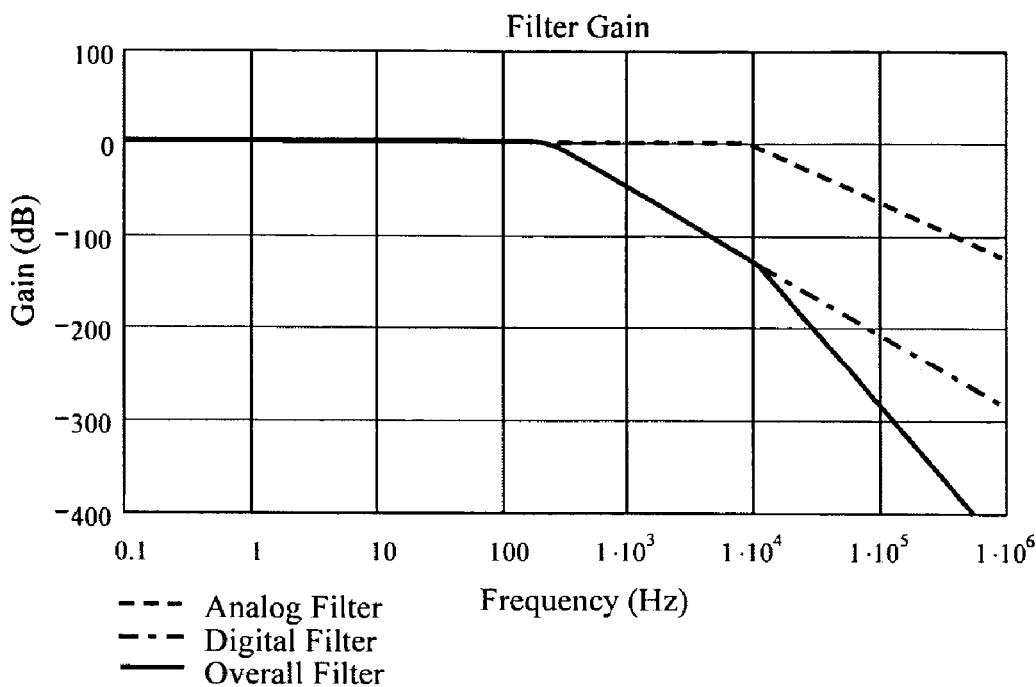
FIGS. 4 and 5 are graphs showing frequency response of filters.
Figure 5:
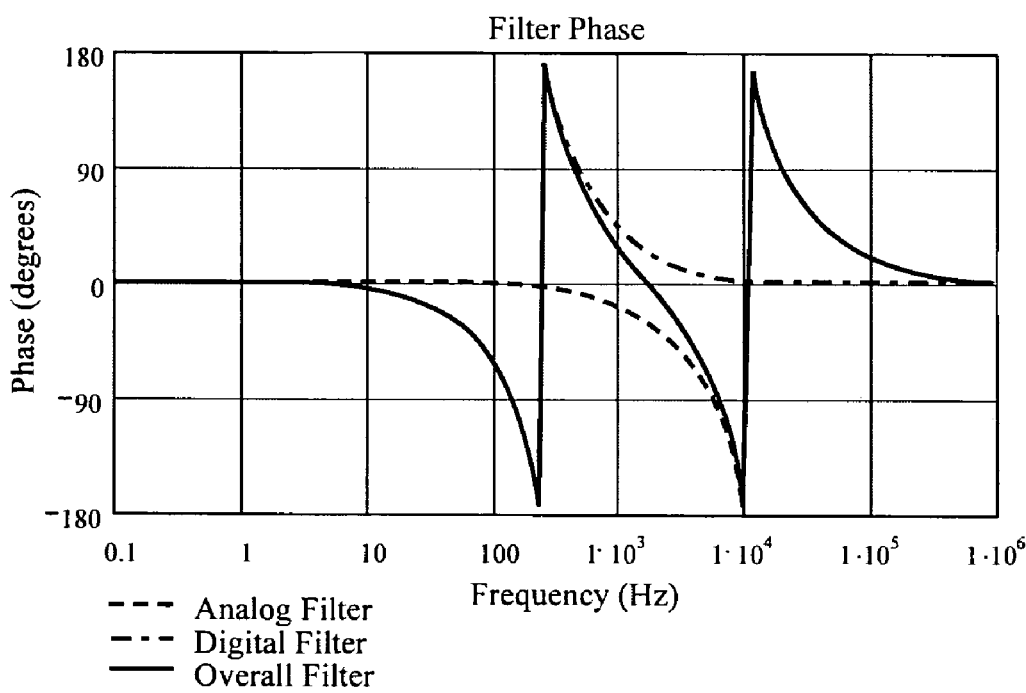

An example of the frequency response is shown in FIGS. 4 and 5. FIG. 4 shows the gain for a fourth order analog LPF with a cutoff frequency of 10,000 Hz, a fourth order digital filters with a cutoff frequency of 250 Hz, and the overall gain for the combination. FIG. 5 shows the corresponding phase shifts.

The advantages of the system described herein are: the electronics design is greatly simplified while retaining high performance; the system is able to support a wide range of sampling rates without requiring physical alterations in the electronics; the cost and size of implementing the system is significantly lower for systems of comparable performance and the system can be implemented for a wide variety of signal rates and resolutions. Very high resolution and dynamic ranges can be obtained by the combination of high speed ADCs and digital filtering and decimation.

The invention claimed is:

1. A method for converting an analog signal to a digital signal comprising the steps of:
    (a) passing the analog signal through a buffer amplifier to amplify the signal;
    (b) effecting low pass filtering of the analog signal in a low pass filter set to pass the highest signal frequency to be retained;
    (c) passing the filtered signal through a drive amplifier;
    (d) converting the analog signal to a digital signal at an analog to digital sampling rate higher than a highest desired sampling rate and such that the highest retained frequency in the sampled signal is above a cutoff frequency of the low pass filter; and
    (e) digital filtering in a digital filter and down sampling the digital signal, wherein a desired overall cutoff frequency is implemented by digital filtering during the digital filtering and down sampling step, the desired output sampling rate is implemented in the down sampling step, and the cutoff frequency of the digital filter is matched to the output rate of the down sampling step.

2. The method of claim 1, wherein the analog to digital sampling rate is two to three orders of magnitude higher than the highest desired sampling rate.

* * * * *